(12) United States Patent
Hsu et al.

(10) Patent No.: US 7,948,055 B2
(45) Date of Patent: May 24, 2011

(54) INDUCTOR FORMED ON SEMICONDUCTOR SUBSTRATE

(75) Inventors: Tsun-Lai Hsu, Hsinchu Hsien (TW); Jun-Hong Ou, Taipei (TW); Jui-Fang Chen, Miaoli County (TW); Ji-Wei Hsu, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 207 days.

(21) Appl. No.: 11/468,789

(22) Filed: Aug. 31, 2006

(65) Prior Publication Data

US 2008/0122028 A1    May 29, 2008

(51) Int. Cl.
*H01L 27/00* (2006.01)
(52) U.S. Cl. .......................... 257/531; 336/200; 336/232
(58) Field of Classification Search .................. 257/531; 336/200, 232
See application file for complete search history.

(56) References Cited

U.S. PATENT DOCUMENTS

| 4,816,784 | A  |   | 3/1989  | Rabjohn |         |
|-----------|----|---|---------|---------|---------|
| 5,963,831 | A  | * | 10/1999 | Fu      | 438/666 |
| 5,966,063 | A  | * | 10/1999 | Sato et al. | 336/200 |
| 6,429,504 | B1 |   | 8/2002  | Beaussart et al. | |
| 6,796,017 | B2 |   | 9/2004  | Harding |         |
| 2001/0040270 | A1 | * | 11/2001 | Kobayashi | 257/531 |

FOREIGN PATENT DOCUMENTS

JP        2000021635        1/2000

OTHER PUBLICATIONS

Article Titled "Design of Multiple-Metal Stacked Inductors Incorporating an Extended Physical Model" jointly authored by Murphy et al., IEEE Transactions on Microwave Theory and Techniques, vol. 53, No. 6, Jun. 2005, pp. 2063-2072).

* cited by examiner

*Primary Examiner* — Kiesha R Bryant
*Assistant Examiner* — Tucker Wright
(74) *Attorney, Agent, or Firm* — WPAT, PC; Justin King

(57) ABSTRACT

An inductor formed on a semiconductor substrate is provided in the present invention. The inductor comprises a metal layer and an insulator layer. The metal layer constitutes the coil of the inductor. The insulator layer comprises at least one insulator slot, and each insulator slot is encompassed in the metal layer.

3 Claims, 12 Drawing Sheets

200

INDUCTOR FORMED ON SEMICONDUCTOR SUBSTRATE

BACKGROUND OF THE INVENTION

1. Field of Invention

The present invention relates to inductor fabrication on a semiconductor substrate. More particularly, the present invention relates to an inductor formed with insulator slots inside, and a method for forming such an inductor

2. Description of Related Art

Inductor is widely used for radio frequency (RF) application. The application covers a very broad spectrum. Some applications, such as personal handy-phone system (PHS), require an inductor to work with frequencies below 1 GHz. Accordingly, the maximum quality factor (abbreviated as Q hereinafter) of the inductor has to move into the sub-GHz range.

For an inductor to have acceptable inductance and maximum quality factor below 1 GHz, a conventional solution is stacking metal layers in parallel. However, this solution increases sidewall capacitance coupling and consequently degrades the broadband performance of the quality factor. Another solution is widening the coil of the inductor, but an over-wide coil tends to violate chemical-mechanical polishing (CMP) rules. In addition, although widening the coil lowers the resistance and improves the maximum quality factor, it also significantly accentuates the variation in the fabrication process.

The maximum quality factor of an inductor should be as high as possible. Therefore it is desirable to have an inductor which works properly with a frequency less than 1 GHz and is without the drawbacks of conventional solutions.

SUMMARY OF THE INVENTION

The present invention is to provide an inductor formed on a semiconductor substrate and a method for forming such an inductor. The inductor provided by the present invention can be widened without violating CMP rules. In addition, the inductor provided by the present invention features acceptable inductance and maximum quality factor comparable to that of conventional inductors under a lower operation frequency (for example, a sub-GHz frequency). This inductor also alleviates the variation in the fabrication process.

For the purposes mentioned above, an inductor formed on a semiconductor substrate is provided in an embodiment of the present invention. The inductor comprises a single metal layer and an insulator layer. The metal layer constitutes the coil of the inductor. The insulator layer comprises at least one insulator slot, and each insulator slot is encompassed in the metal layer.

In this embodiment, the insulator slot may be formed using silicon oxide. The insulator layer may comprise a row of insulator slots arranged along the coil of the inductor.

For the purposes mentioned above, an inductor formed on a semiconductor substrate is provided in another embodiment of the present invention. The inductor comprises a plurality of metal layers and an insulator layer. The metal layers constitute the coil of the inductor. The insulator layer comprises at least one insulator slot, and each insulator slot is encompassed in one the metal layers.

In this embodiment, the insulator slot may be formed using silicon oxide. The insulator layer may comprise a row of insulator slots arranged along the coil of the inductor.

In this embodiment, each insulator slot may be encompassed in the same one of the metal layers. Alternatively, the insulator layer may comprise a plurality of insulator slots, and the insulator slots may be distributed in each one of the metal layers.

In this embodiment, the metal layers may be connected in parallel to constitute the coil of the inductor. Alternatively, the metal layers may be connected in series to constitute the coil of the inductor.

For the purposes mentioned above, a method for forming an inductor on a semiconductor substrate is provided in another embodiment of the present invention. The method comprises the following steps. First, form a single metal layer on the semiconductor substrate, and then form an insulator layer on the semiconductor substrate. The metal layer constitutes the coil of the inductor. The insulator layer comprises at least one insulator slot, and each insulator slot is encompassed in the metal layer.

For the purposes mentioned above, a method for forming an inductor on a semiconductor substrate is provided in another embodiment of the present invention. The method comprises the following steps. First, form a plurality of metal layers on the semiconductor substrate, and then form an insulator layer on the semiconductor substrate. The metal layers constitute the coil of the inductor. The insulator layer comprises at least one insulator slot, and each insulator slot is encompassed in one the metal layers.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 4A and 5B are schematic diagrams showing an inductor according to an embodiment of the present invention.

DESCRIPTION OF EMBODIMENTS

Figure 1:
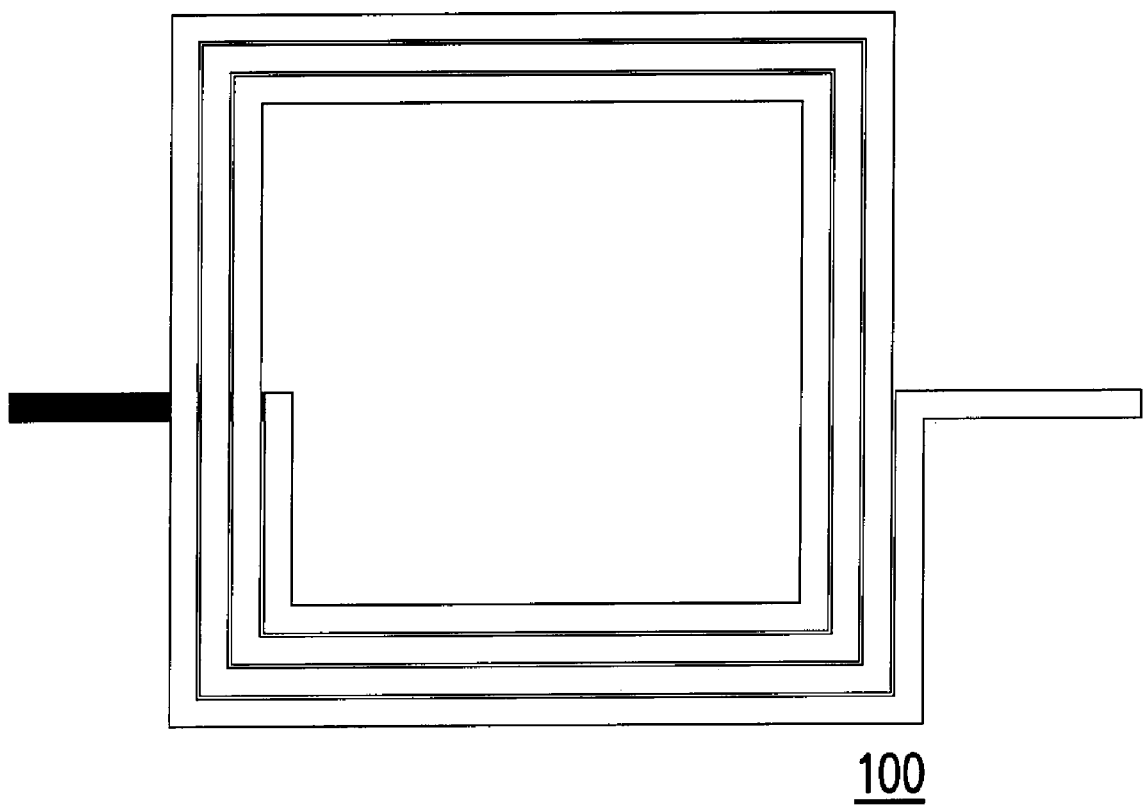
FIG. 1 is a schematic diagram showing a conventional inductor formed on a semiconductor substrate.

Reference will now be made in detail to the present preferred embodiments of the invention, examples of which are illustrated in the accompanying drawings. Wherever possible, the same reference numbers are used in the drawings and the description to refer to the same or like parts.

Figure 2A:
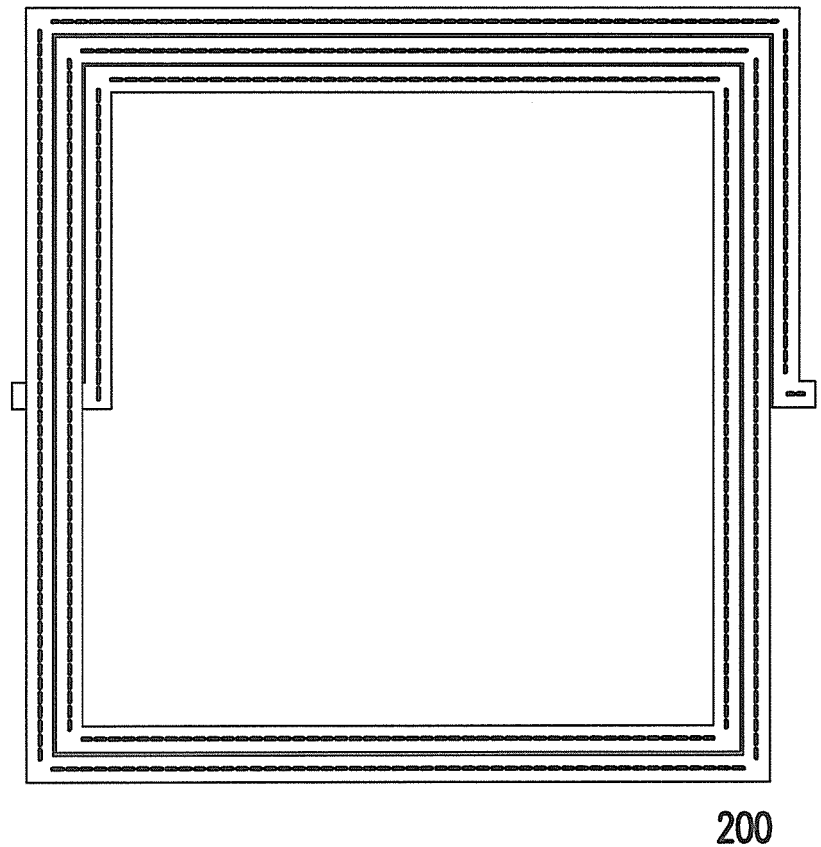
FIGS. 2A and 2B are schematic diagrams showing an inductor according to an embodiment of the present invention.
Figure 2B:
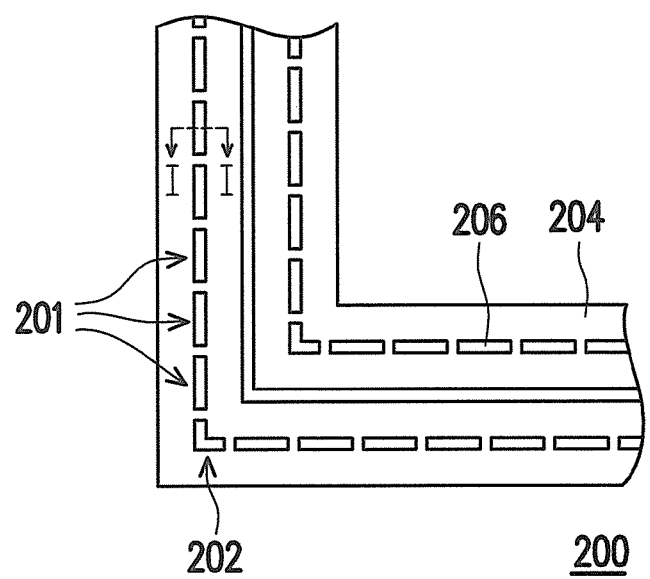
Figure 2C:
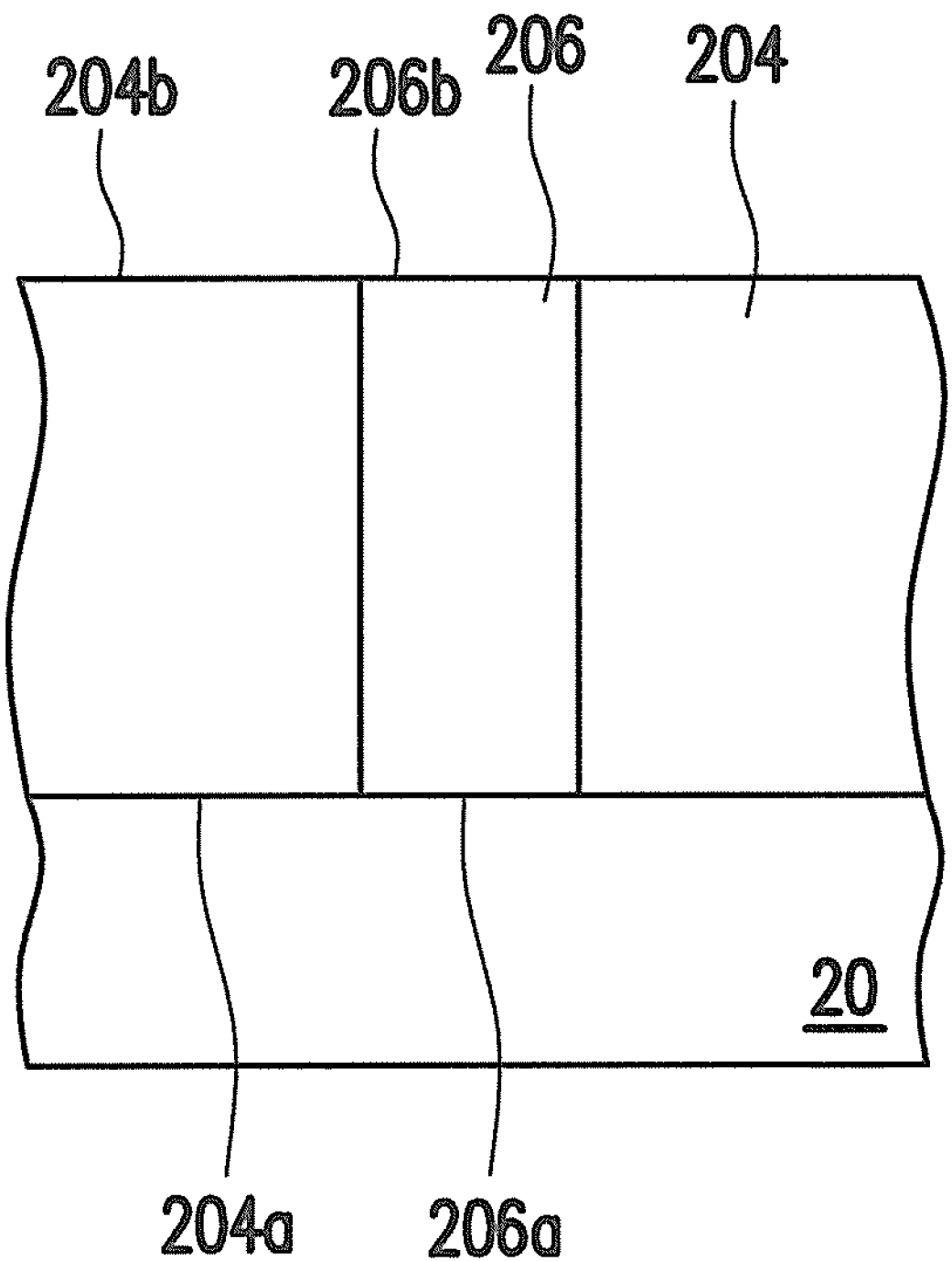
FIG. 2C is schematic cross-sectional view showing the inductor along the line I-I in FIG. 2B.

FIG. 1 illustrates a conventional inductor 100 fabricated on a semiconductor substrate (not shown). Inductor 100 is formed purely with metal, without any insulator material. In contrast, FIG. 2A illustrates an inductor 200 according to an embodiment of the present invention. FIG. 2B is an enlarged view of the lower left corner of inductor 200. FIG. 2C is schematic cross-sectional view showing the inductor 200 along the line I-I in FIG. 2B. Inductor 200 is a metallic inductor with insulator slots 201 and 202 embedded inside, which is also formed on a semiconductor substrate 20 (not shown). Inductor 200 comprises a single metal layer 204 and an insulator layer 206. The metal layer 204 constitutes the coil of the inductor 200. The insulator layer 206 comprises at least one insulator slot 201 or 202, and each insulator slot 201 or 202 is encompassed in the metal layer 204. There is a row of insulator slots 201 arranged along the entire length of the coil of inductor 200. Referring to FIG. 2C, for example, each of insulator slots 201 and 202 is encompassed inside the metal layer 204. Specifically, the metal layer 204 includes a bottom surface 204$a$ near the semiconductor substrate 20 and a top surface 204$b$ far from the semiconductor substrate 20. The insulator layer 206 includes a bottom surface 206$a$ near the semiconductor substrate 20 and a top surface 206$b$ far the semiconductor substrate 20, and the insulator layer 206 doe not cover the top surface 204$b$ and the bottom surface 206$a$ of the metal layer 204, so that the insulator slot 201 are encompassed in the metal layer 204. Each insulator slot 201 is a slim rectangular in shape, while insulator slot 202 is L-shaped. The insulator slots 201 and 202 may be formed using silicon oxide (for example, $SiO_2$).

Figure 3A:
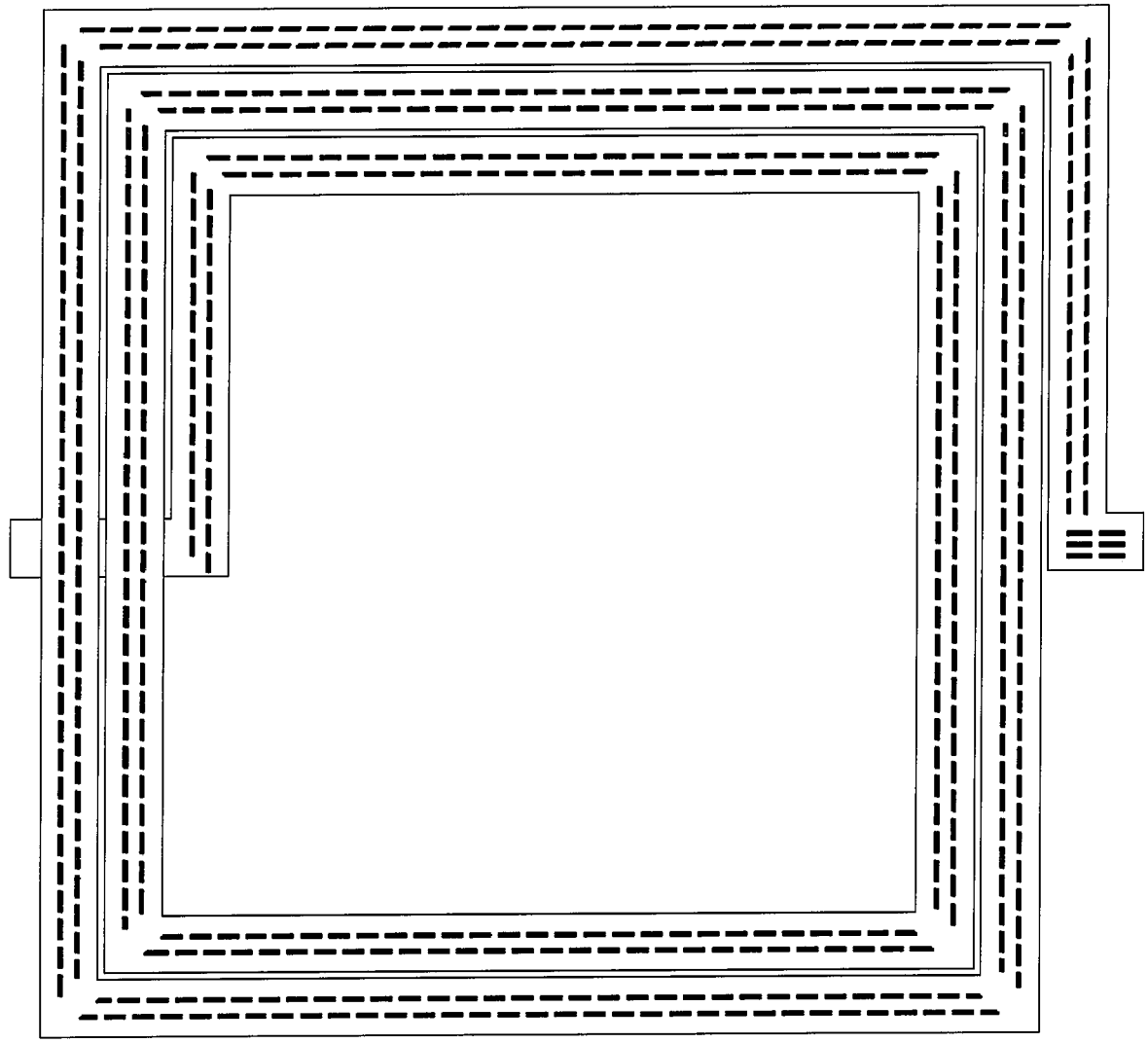
FIGS. 3A and 3B are schematic diagrams showing an inductor according to an embodiment of the present invention.
Figure 3B:
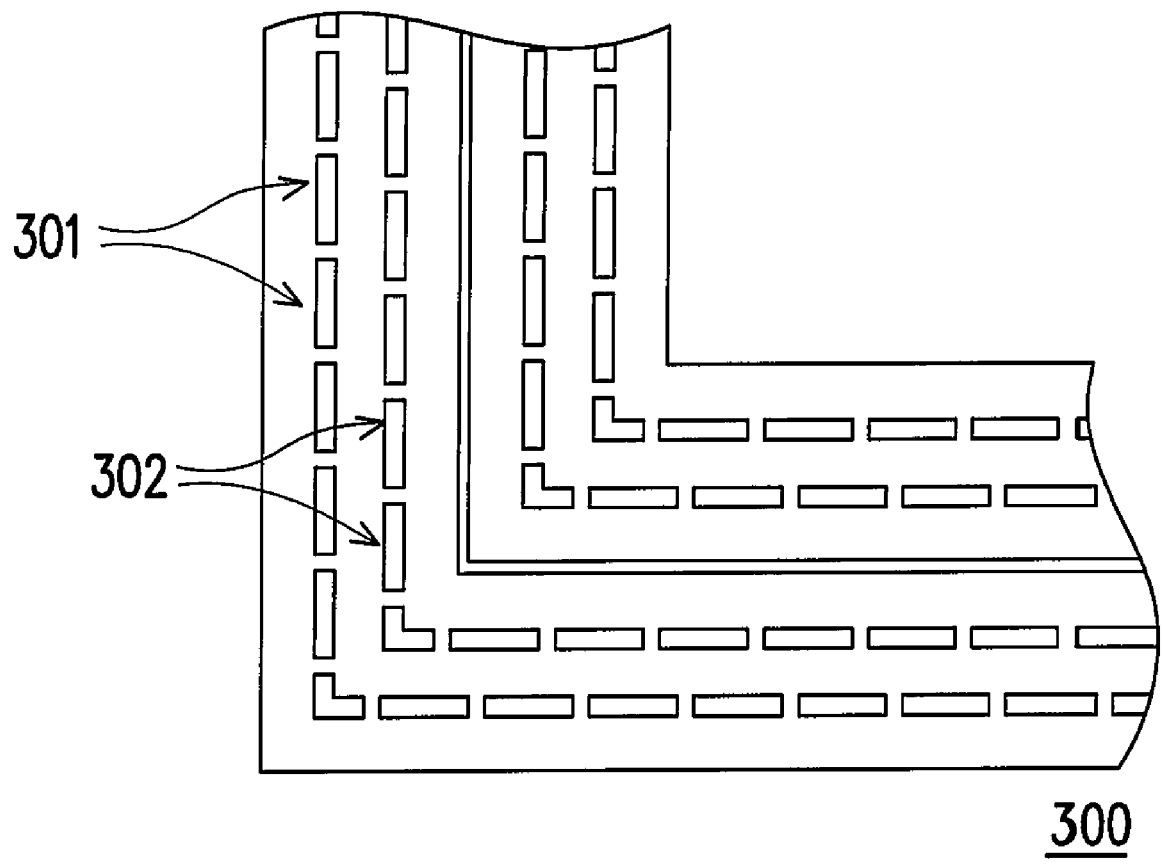
Figure 4A:
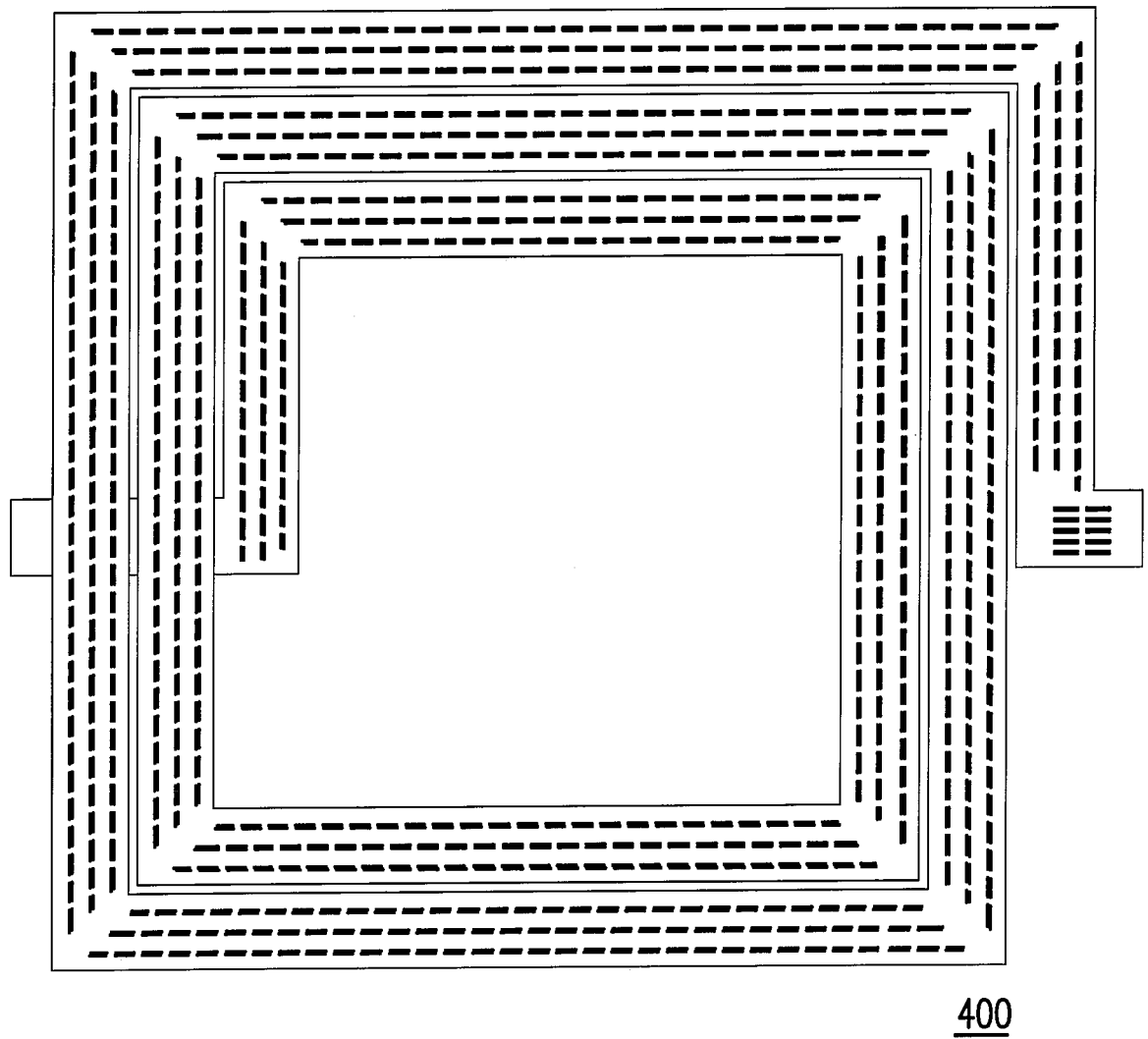
FIGS. 4A and 4B are schematic diagrams showing an inductor according to an embodiment of the present invention.
Figure 4B:
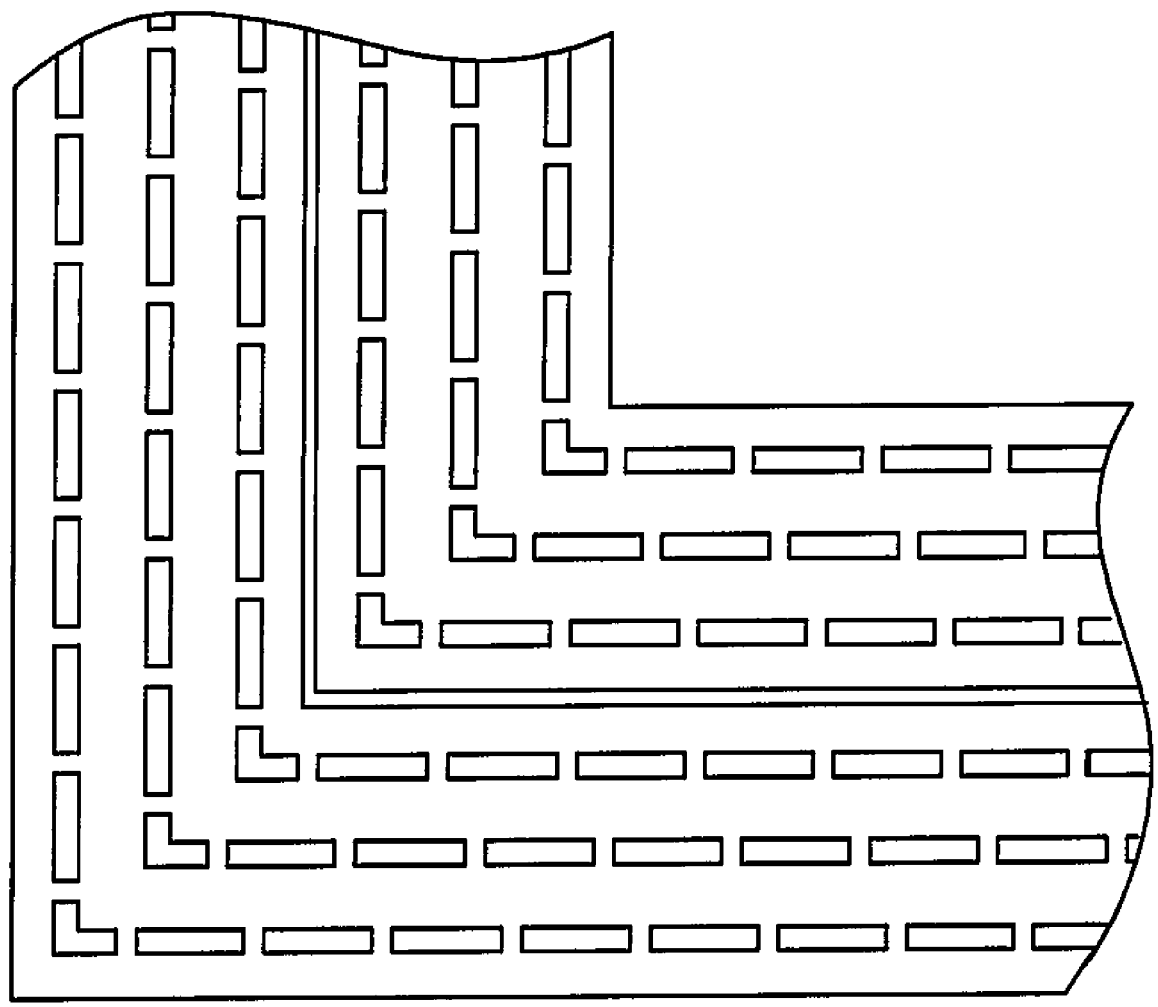
Figure 5A:
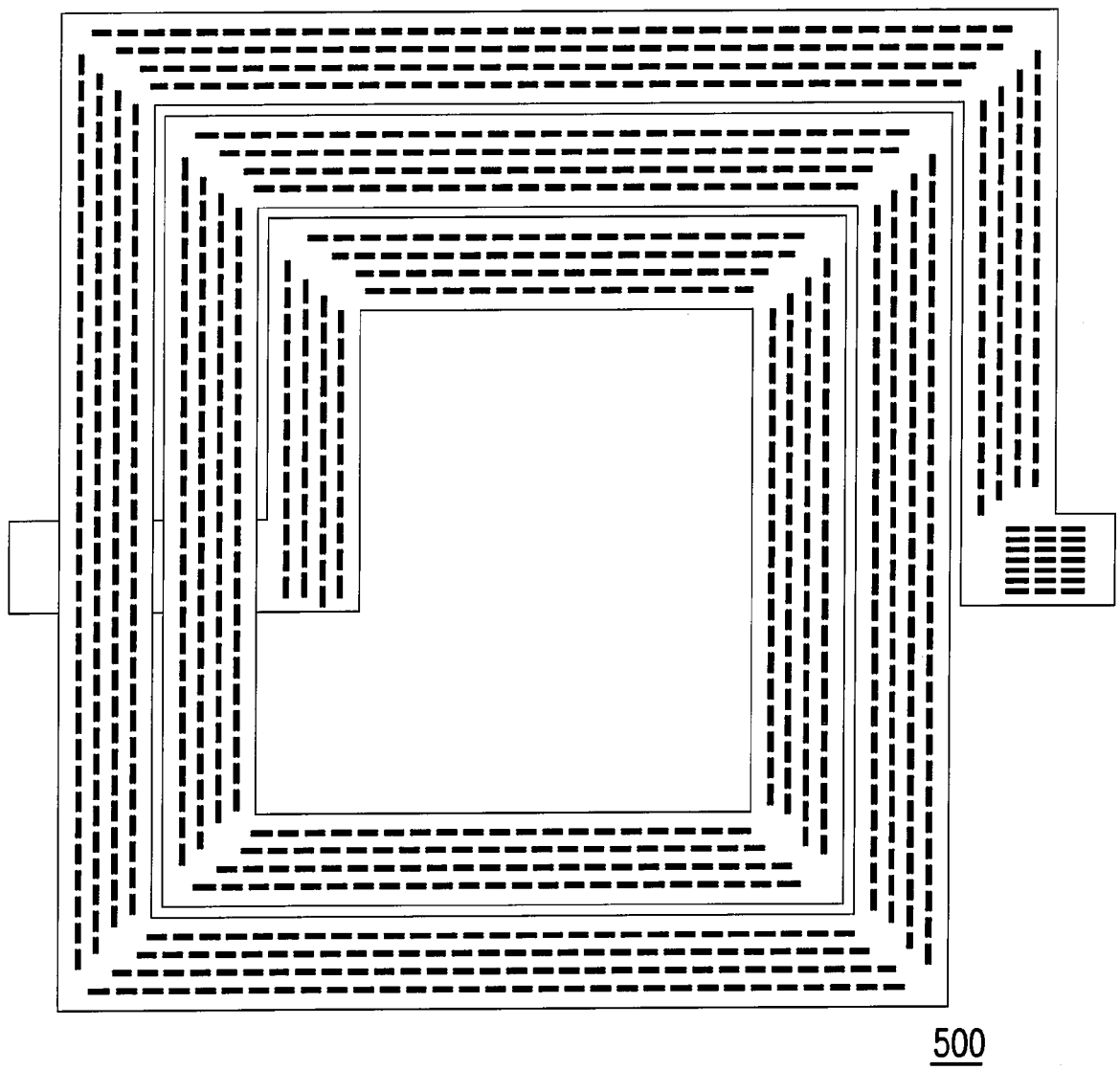
Figure 5B:
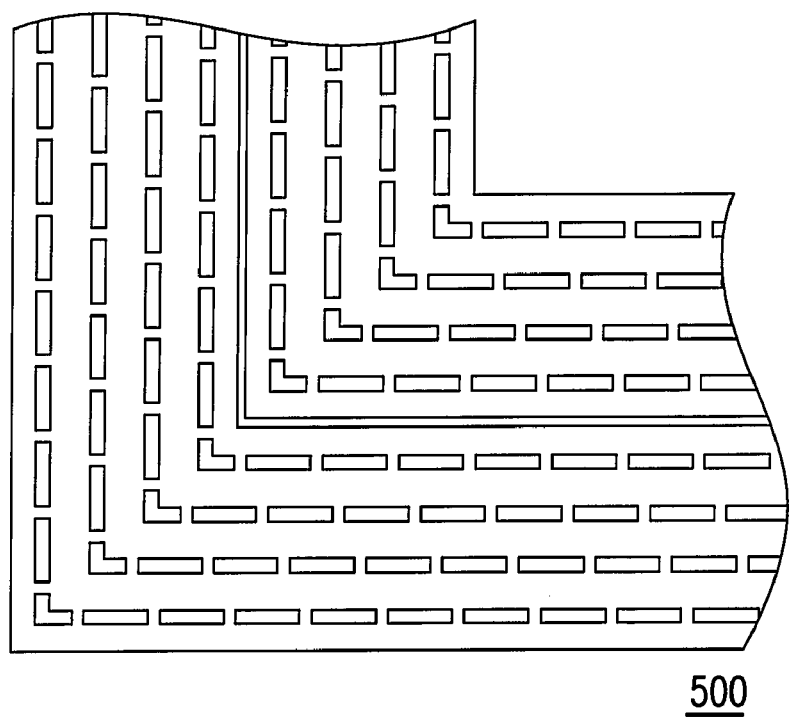

In the scope of the present invention, the insulator slots are not limited to a single-row arrangement. Insulator slots may be arranged into multiple rows. The insulator slots of different rows may be placed in parallel with one another or be placed in an alternate fashion. There is no limitation to the relative positions of the insulator slots. There is also no limitation to the number of rows. For example, FIG. 3A illustrates an inductor 300 according to another embodiment of the present invention. There are two rows along the coil of inductor 300. FIG. 3B is en enlarged view of the lower left corner of inductor 300. As can be seen, one of the rows includes the exemplary insulator slots 301 and the other row includes the exemplary insulator slots 302. Similarly, FIGS. 4A and 4B illustrate an inductor 400 with three rows of insulator slots according to another embodiment of the present invention. FIGS. 5A and 5B illustrate an inductor 500 with four rows of insulator slots according to yet another embodiment of the present invention.

Figure 6:
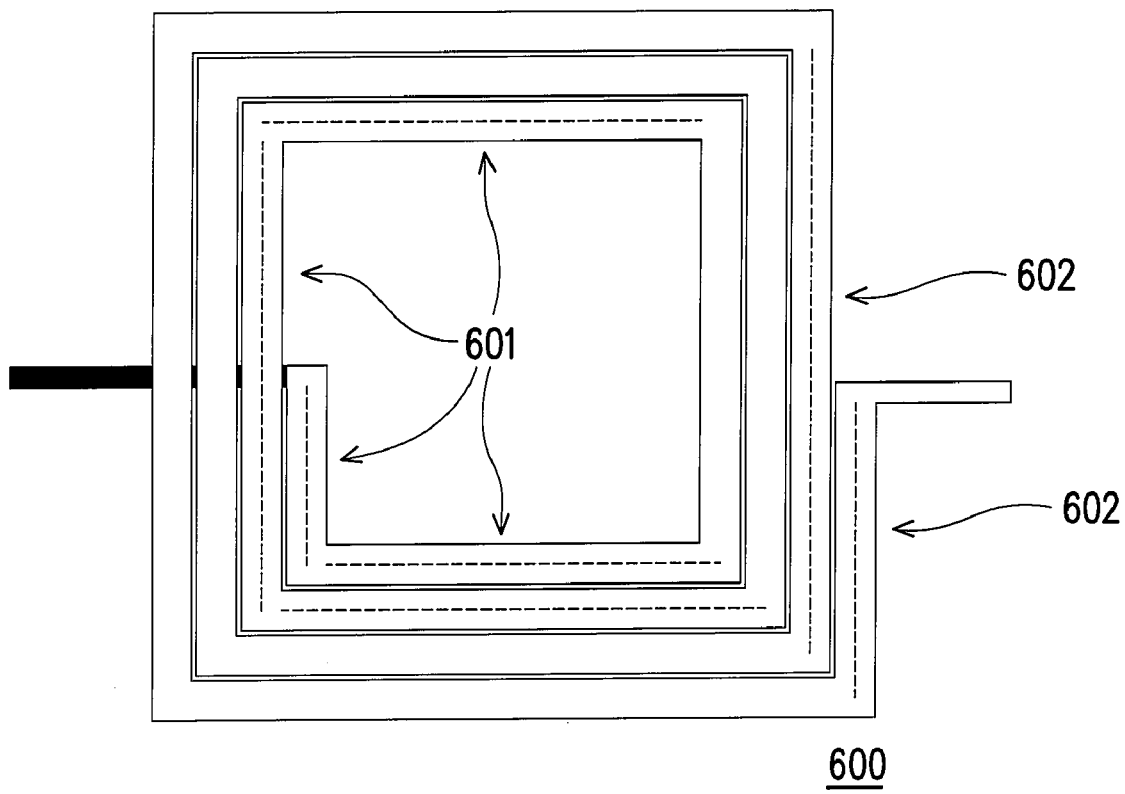
FIG. 6, FIG. 7 and FIG. 8 are schematic diagrams showing inductors according to various embodiments of the present invention.

The arrangement of insulator slots is quite flexible in the scope of the present invention. Each insulator slot may be formed in arbitrary size and shape. The number and arrangement of insulator slots are also arbitrary. For example, insulator slots may be distributed either evenly or unevenly in the coil the inductor. In other words, insulator slots may be distributed either symmetrically or asymmetrically in the coil the inductor. FIG. 6 is an example of uneven distribution. Insulator slots are embedded only in sections 601 and 602 of the coil of inductor 600. However, it is preferred that insulator slots have an even and symmetrical distribution in the inductor coil. Furthermore, there is no limit regarding the position of an insulator slot relative to the boundary surface of the inductor. An insulator slot may be at arbitrary distance from any boundary surface of the containing metal layer. An insulator slot may be completely embedded in the metal layer, in other words, surrounded in every direction by the metal layer. Alternatively, an insulator slot may be partially embedded in the metal layer. In such a case, an insulator slot may emerge from one or more boundary surfaces of the metal layer.

Figure 7:
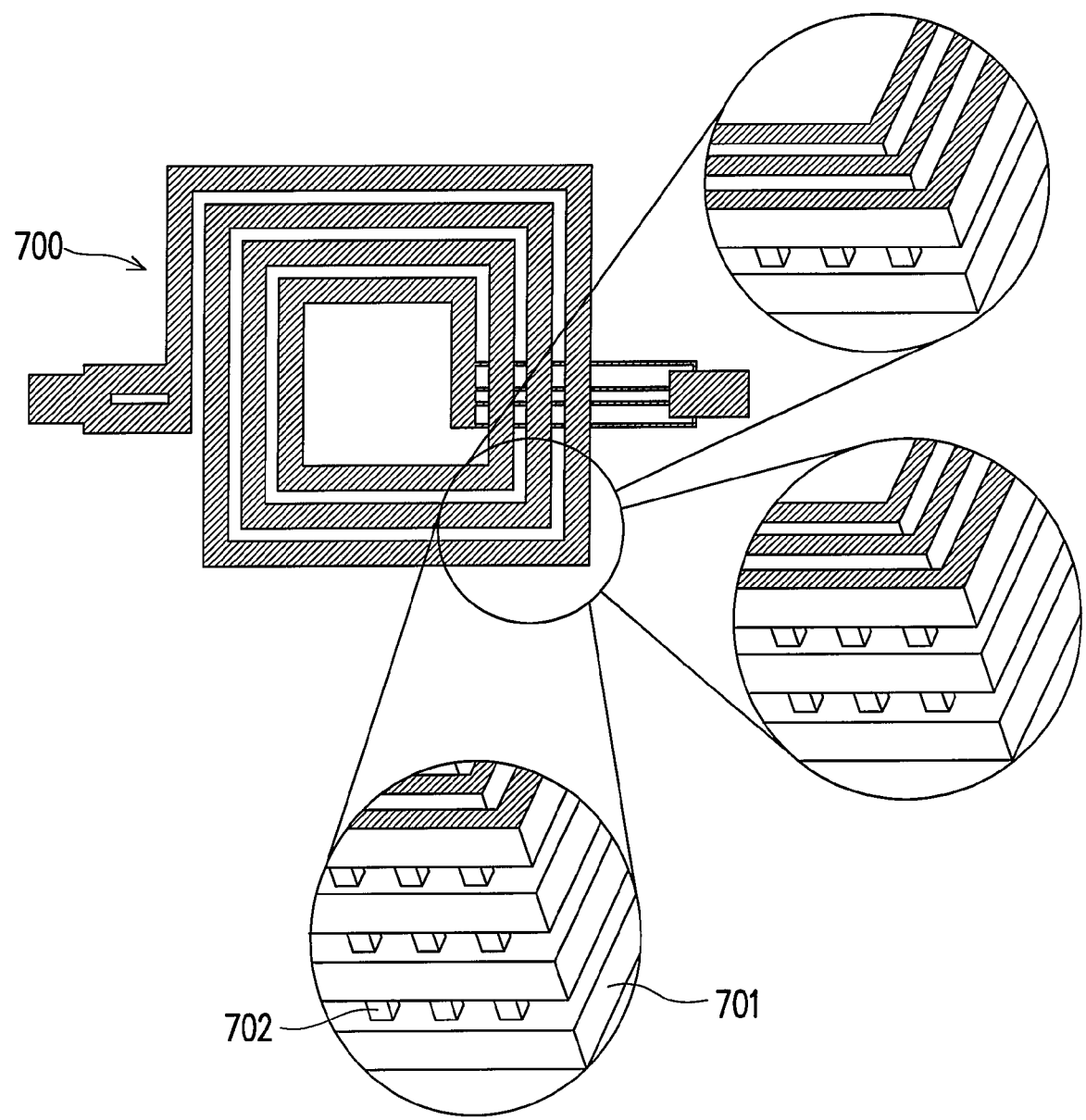
Figure 8:
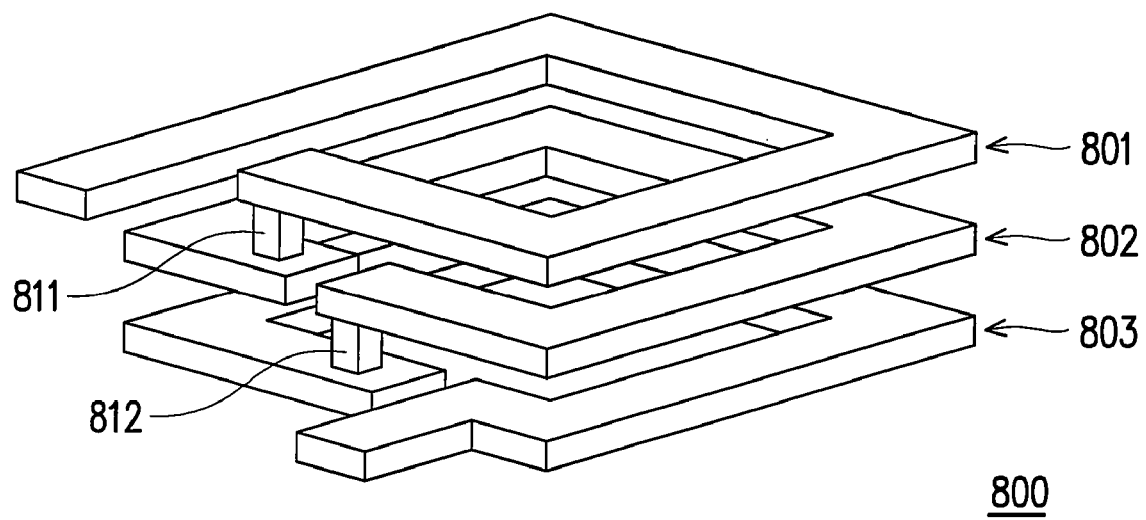

In the above embodiments, each inductor comprises a single metal layer. The present invention also provides inductors comprising multiple metal layers. The metal layers constitute the coil of such an inductor. FIG. 7 illustrates an inductor 700 according to an embodiment of the present invention. As shown in FIG. 7, inductor 700 may comprise three, four or five metal layers. The metal layers (for example, 701) are stacked in parallel and are connected by vias (for example, 702). In contrast, FIG. 8 illustrates another inductor 800 according to another embodiment of the present invention. Three metal layers 801-803 are connected in series by vias 811 and 812 to constitute the coil of inductor 800.

For simplicity, insulator slots are not shown in FIG. 7 and FIG. 8. In fact, each of inductors 700 and 800 comprises at least an insulator layer. The insulator layer comprises at least one insulator slot, and each insulator slot is encompassed in one the metal layers. The distribution of insulator slots among the metal layers is quite flexible in the scope of the present invention. For example, each insulator slot may be encompassed in the same metal layer. Besides, the insulator slots may be distributed in each of the metal layers, or be distributed only in part of the metal layers.

As discussed above, there is no limitation regarding the sizes, shapes, positions, number, arrangement, distribution and other characteristics of the insulator slots. The only restriction is that the inductor has to comply with CMP rules and the maximum quality factor of the inductor has to be in the desired low frequency range (for example, below 1 GHz).

Figure 9:
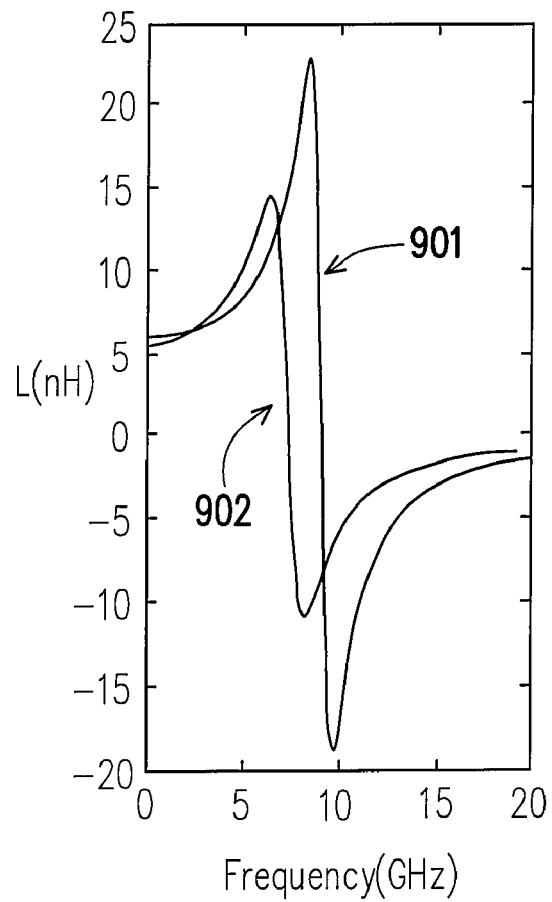
FIG. 9 is a plot of inductance versus frequency of a conventional inductor and an inductor according to an embodiment of the present invention.
Figure 10:
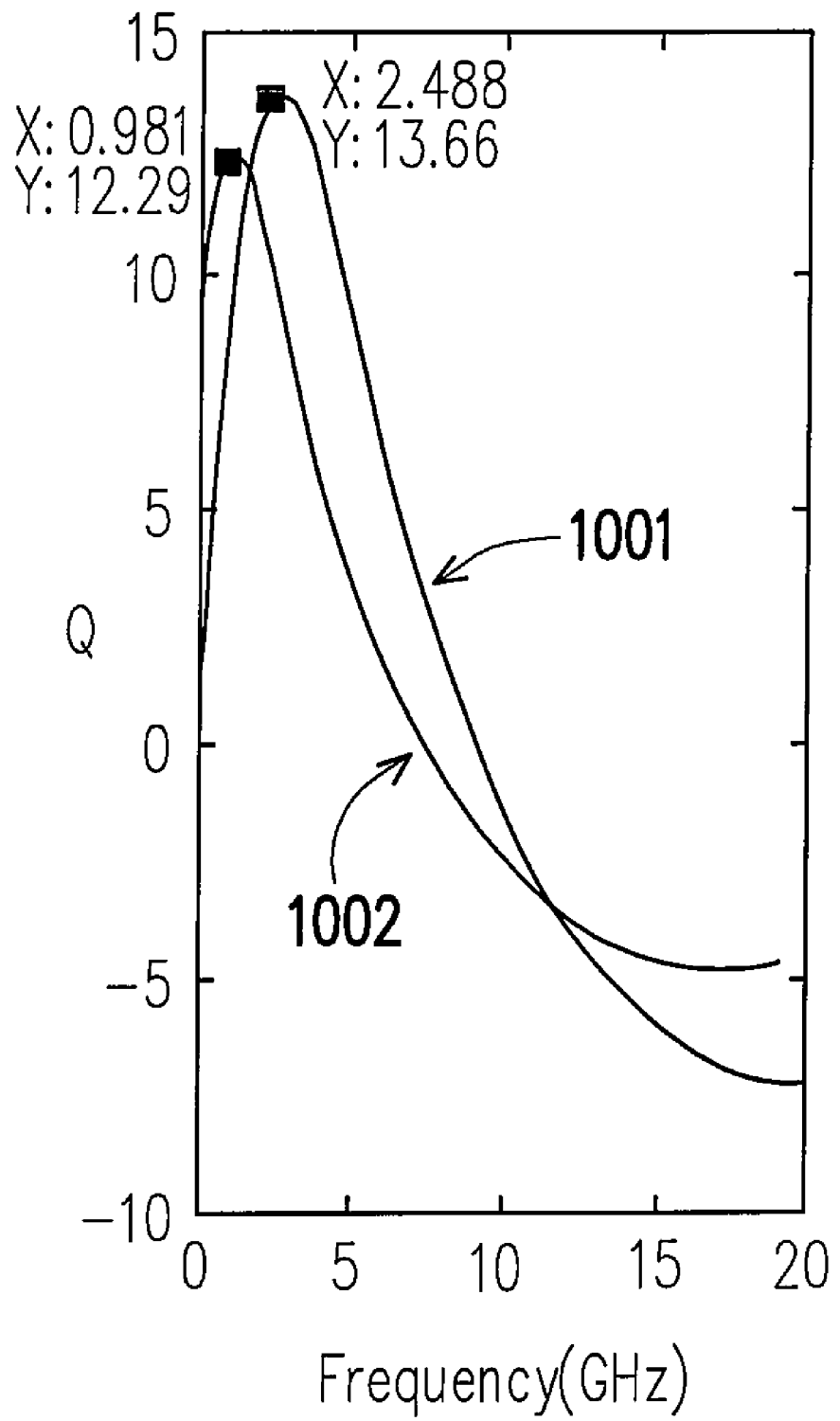
FIG. 10 is a plot of quality factor versus frequency of a conventional inductor and an inductor according to an embodiment of the present invention.

FIG. 9 and FIG. 10 illustrate the effect of an embodiment of the present invention. FIG. 9 is a plot of inductance versus frequency of inductor 100 in FIG. 1 and inductor 600 in FIG. 6. Curve 901 in FIG. 9 is the plot of inductor 100, while curve 902 is the plot of inductor 600. FIG. 10 is a plot of quality factor versus frequency of inductor 100 and inductor 600. Curve 1001 in FIG. 10 is the plot of inductor 100, while curve 1002 is the plot of inductor 600. Inductor 100 is formed using metal only, with a coil width of 10 micrometers and an inner diameter of approximately 200 micrometers. Inductor 600 is formed using metal and insulator slots, with a coil width of 20 micrometers and an inner diameter of approximately 200 micrometers. As shown in FIG. 10, this embodiment of the present invention moves the maximum quality factor from the conventional operation frequency of 2.488 GHz to the desired lower frequency of 0.981 GHz. Furthermore, the maximum quality factor of inductor 600 does not decay too much from that of inductor 100.

In addition to inductor structures as discussed in the embodiments above, the present invention also provides a method for forming an inductor on a semiconductor substrate. In fact, the method is for forming inductors in the embodiments above. The major steps of the method are forming one or more metal layer on the semiconductor substrate, and then forming an insulator layer on the semiconductor substrate. The metal layers constitute the coil of the inductor. The insulator layer comprises at least one insulator slot, and each insulator slot is encompassed in one the metal layers. The technical details of the method are the same as those of the inductor structures discussed in the previous embodiments so they are not repeated here.

Thanks to the insulator slots, the coil of the inductor provided by the present invention can be widened without violating CMP rules. In addition, the inductor provided by the present invention features acceptable inductance and maximum quality factor comparable to that of conventional inductors under a lower operation frequency (for example, a sub-GHz frequency).

The present invention has been disclosed above in the preferred embodiments, but is not limited to those. It is known to persons skilled in the art that some modifications and innovations may be made without departing from the spirit and scope of the present invention. Therefore, the scope of the present invention should be defined by the following claims.

What is claimed is:

1. An inductor formed on a semiconductor substrate, comprising:
    a coil formed with at least a single metal layer having a plurality of slots therein, wherein the single metal layer includes a bottom surface near the semiconductor substrate and a top surface far from the semiconductor substrate; and
    an insulator layer filled in the plurality of slots, wherein the insulator layer is encompassed in the single metal layer and the insulator layer does not cover the top surface and the bottom surface of the single metal layer.

2. The inductor of claim 1, wherein the insulator layer is formed using silicon oxide.

3. The inductor of claim 1, wherein the slots are arranged in at least a row.

* * * * *